(12) United States Patent
Lo

(10) Patent No.: US 9,818,632 B2
(45) Date of Patent: Nov. 14, 2017

(54) TRAY FOR SEMICONDUCTOR DEVICES

(71) Applicant: Yu-Nan Lo, Taichung (TW)

(72) Inventor: Yu-Nan Lo, Taichung (TW)

( * ) Notice: Subject to any disclaimer, the term of this patent is extended or adjusted under 35 U.S.C. 154(b) by 91 days.

(21) Appl. No.: 14/981,781

(22) Filed: Dec. 28, 2015

(65) Prior Publication Data

US 2017/0186636 A1  Jun. 29, 2017

(51) Int. Cl.
*B65D 85/30* (2006.01)
*H01L 21/673* (2006.01)

(52) U.S. Cl.
CPC .............. *H01L 21/67333* (2013.01)

(58) Field of Classification Search
CPC ............... H01L 21/67346; H01L 21/67333
USPC ....... 206/706, 707, 722, 724–727, 561, 564, 206/565
See application file for complete search history.

(56) References Cited

U.S. PATENT DOCUMENTS

| | | | | |
|---|---|---|---|---|
| 5,066,245 A * | 11/1991 | Walker | ........ | H05K 7/1023 206/724 |
| 5,418,692 A * | 5/1995 | Nemoto | ........ | H01L 21/67333 174/559 |
| 5,481,438 A * | 1/1996 | Nemoto | ........ | H01L 21/67333 174/255 |
| 5,791,486 A * | 8/1998 | Brahmbhatt | ...... | H01L 21/67333 206/509 |
| 5,794,783 A * | 8/1998 | Carter | ........ | H01L 21/67333 206/562 |
| 6,264,037 B1 * | 7/2001 | Maston | ........ | H01L 21/67333 206/725 |
| 6,914,771 B2 * | 7/2005 | Ono | ........ | H01L 21/67333 206/714 |
| 7,410,060 B2 * | 8/2008 | Crisp | ........ | H01L 21/67333 206/564 |
| 2002/0003101 A1 * | 1/2002 | Sembonmatsu | .. | H01L 21/67333 206/726 |
| 2004/0206661 A1 * | 10/2004 | Gardiner | ........ | H05K 13/0084 206/701 |
| 2008/0173569 A1 * | 7/2008 | Forsyth | ........ | H01L 21/67333 206/725 |

* cited by examiner

*Primary Examiner* — Luan K Bui
(74) *Attorney, Agent, or Firm* — Bruce Stone LLP; Joseph Bruce

(57) ABSTRACT

A tray for semiconductor devices includes a base with a positioning unit. The positioning unit includes a plurality of tiered projections which jointly define and surround an enclosed space for receiving a semiconductor device. Each tiered projection is a two-tier structure including an inclined surface portion and an upright surface portion connected to the inclined surface portion, and a semiconductor device can be received, and limited in position, between the upright surface portions. When the tray bounces due external vibrations such that the semiconductor device received in the enclosed space is moved away from the upright surface portions to the inclined surface portions, the inclined surface portions of the tiered projections can guide and adjust the semiconductor device, returning the semiconductor device to between the upright surface portions, in order for the tray to carry the semiconductor device stably.

4 Claims, 10 Drawing Sheets

TRAY FOR SEMICONDUCTOR DEVICES

BACKGROUND OF THE INVENTION

Technical Field

The present invention relates to a supporting structure for semiconductor devices and more particularly to a tray for semiconductor devices.

Description of Related Art

As the degree of automation of semiconductor device packaging increases, so does the importance of trays for carrying and transporting semiconductor devices during the packaging process. A crucial factor in choosing trays for semiconductor devices is the trays' carrying stability. The higher the carrying stability, the more the yield of a semiconductor device packaging process can be ensured. Therefore, the carrying stability of trays for semiconductor devices is critical to both product yield and production cost.

FIG. 1 and FIG. 2 show a conventional tray 10 for semiconductor devices. One side of the tray 10 is formed with a plurality of positioning units 11. Each positioning unit 11 includes four L-shaped ribs 111, which are planar structures. A semiconductor device P can be placed and positioned in between the four L-shaped ribs 111 of a positioning unit 11 so that the periphery of the semiconductor device P lies against the upright surfaces of the four L-shaped ribs 111. To facilitate placement and removal of the semiconductor device P, a spacing S is provided between each two adjacent L-shaped ribs 111, and because of that, the semiconductor device P is restrained only at its four corners.

During the packaging process, the tray 10 is transported continuously and is therefore subject to incessant vibrations of transportation. The vibrations may force the semiconductor device P out of the positioning unit 11, as shown in FIG. 2. If the semiconductor device P is dislodged from the positioning unit 11 without being detected in time, it is very likely that the semiconductor device P will be compressed and damaged by another identical tray stacked on the tray 10, for it is common practice to stack the trays together for storage after the packaging process is completed. Such damage will cause unnecessary loss, raise production cost, and thus compromise economic benefit. In view of the above, the inventor of the present invention conducted extensive research and repeated trials and finally succeeded in developing a tray for semiconductor devices as disclosed herein.

BRIEF SUMMARY OF THE INVENTION

The present invention provides a tray for semiconductor devices, the main objective being to improve the carrying stability of the conventional trays for semiconductor devices.

To achieve this objective, the present invention provides a tray for semiconductor devices, wherein the tray includes a base formed with at least one positioning unit on one side, and wherein the tray is characterized by the following features:

The positioning unit includes a plurality of tiered projections which are spaced from one another. Each tiered projection includes an inclined surface portion and an upright surface portion connected between the inclined surface portion and the base, wherein the inclined surface portion is a surface inclined with respect to the upright surface portion. The upright surface portions of the tiered projections jointly define, and face, an enclosed space for receiving a semiconductor device.

According to the present invention, the plural tiered projections surround the enclosed space for receiving a semiconductor device. As each tiered projection is composed of an inclined surface portion and an upright surface portion, a semiconductor device which is received in the enclosed space and then bounces from its original position corresponding to the upright surface portions to a position corresponding to the inclined surface portions will be guided by the inclined surface portions of the tiered projections toward the enclosed space. Thus, the tray automatically adjusts the semiconductor device and returns it to the enclosed space to avoid compressive damage. The tray, therefore, features enhanced carrying stability and helps increase product yield.

DETAILED DESCRIPTION OF THE INVENTION

Figure 1:
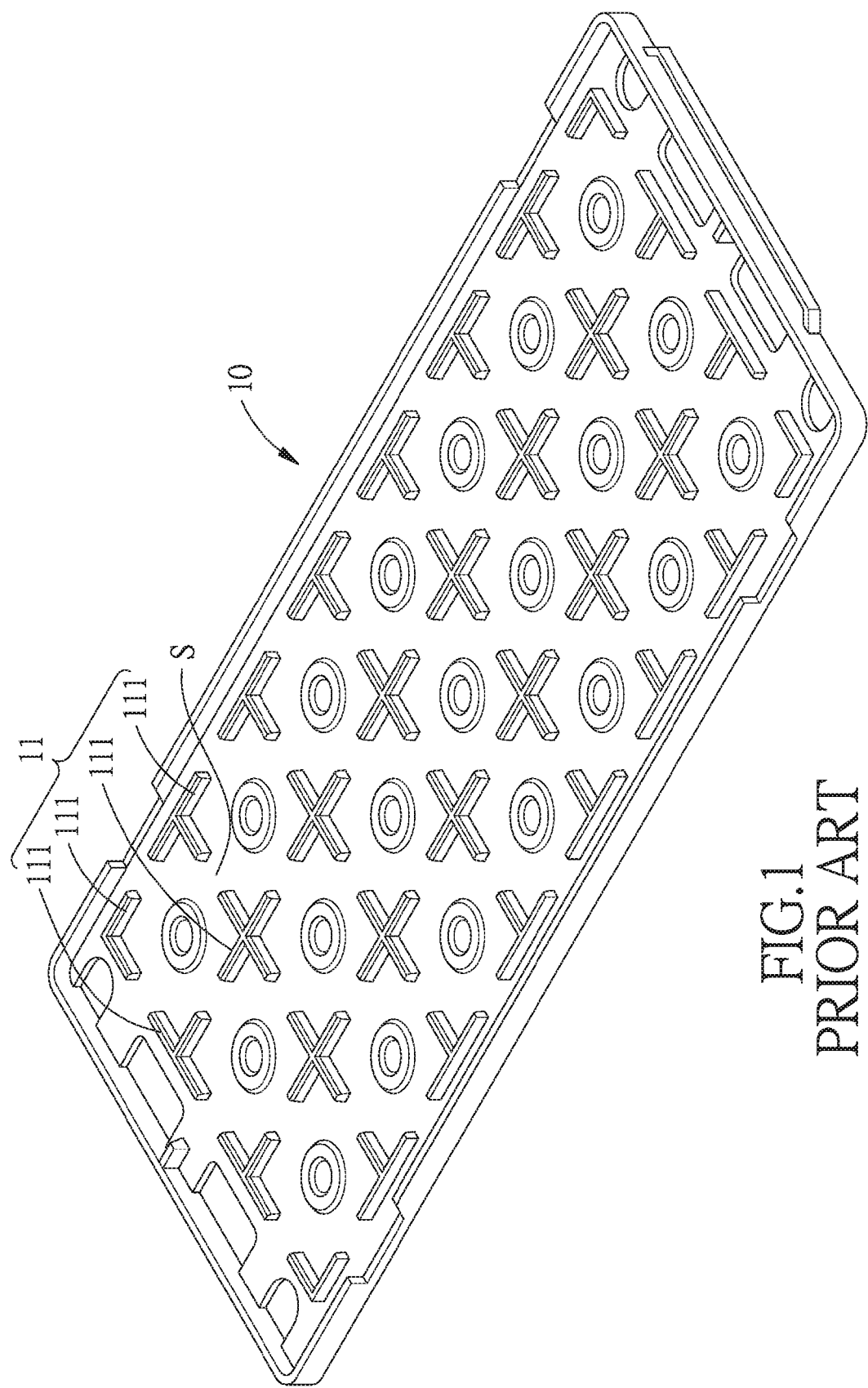
FIG. 1 is a perspective view of a conventional tray for semiconductor devices.
Figure 2:
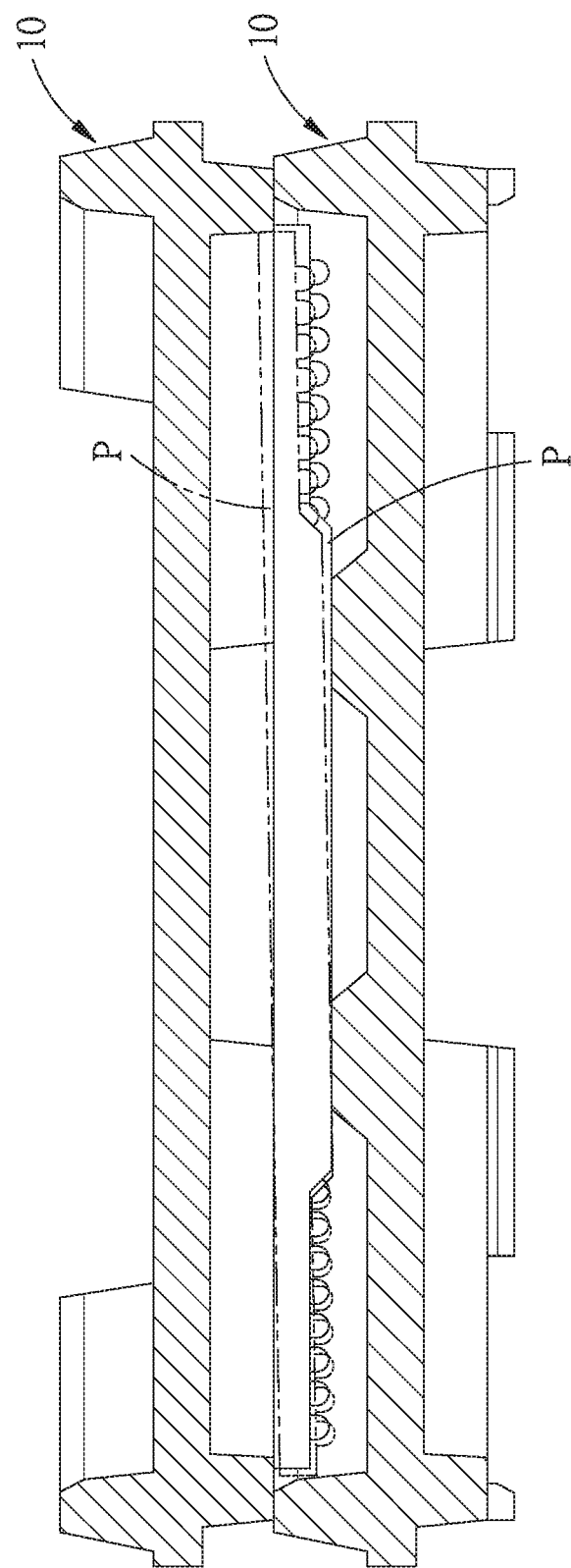
FIG. 2 is a sectional view of a stack of the conventional trays for semiconductor devices.
Figure 3:
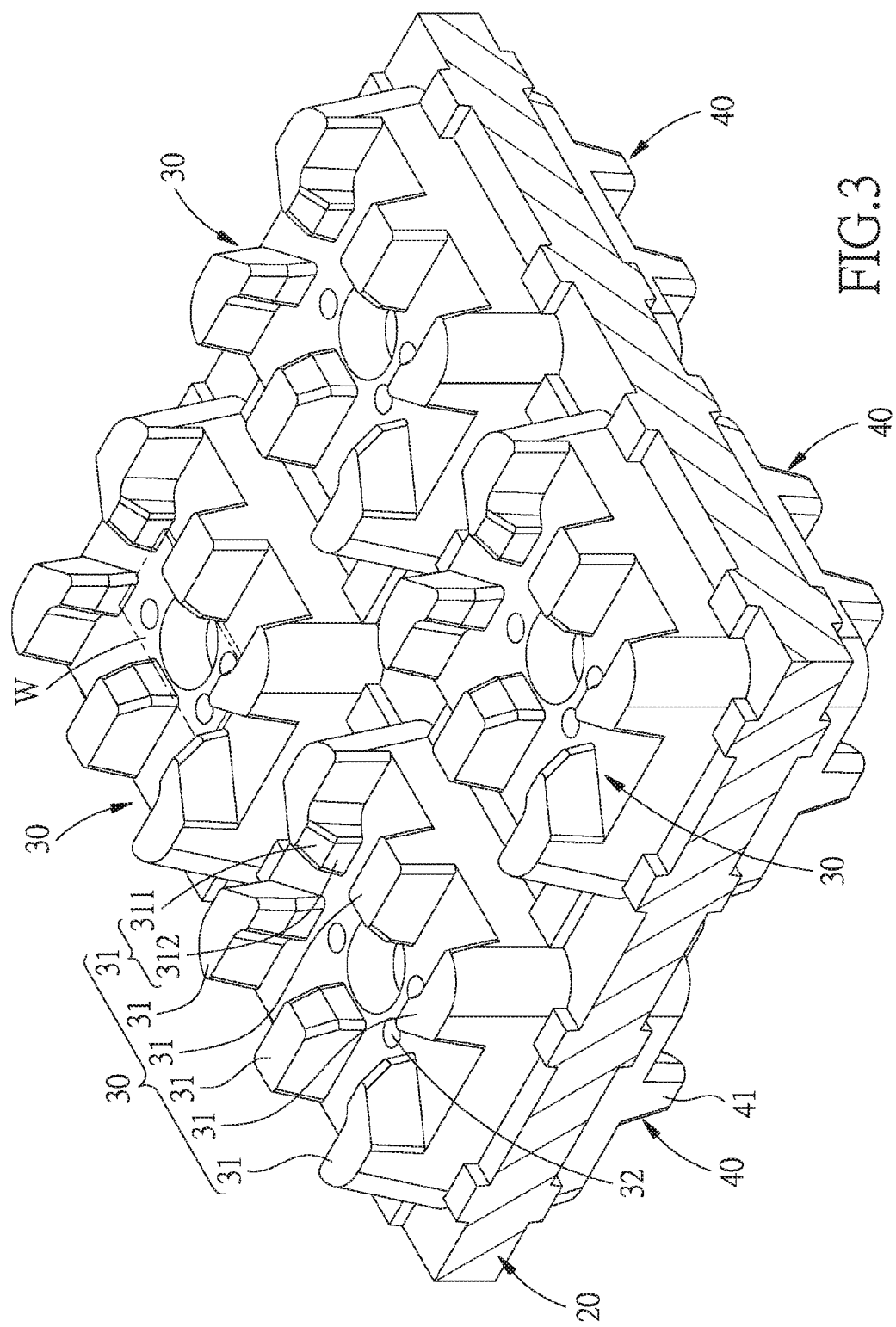
FIG. 3 is a perspective view of the tray for semiconductor devices in a first embodiment of the present invention.
Figure 4:
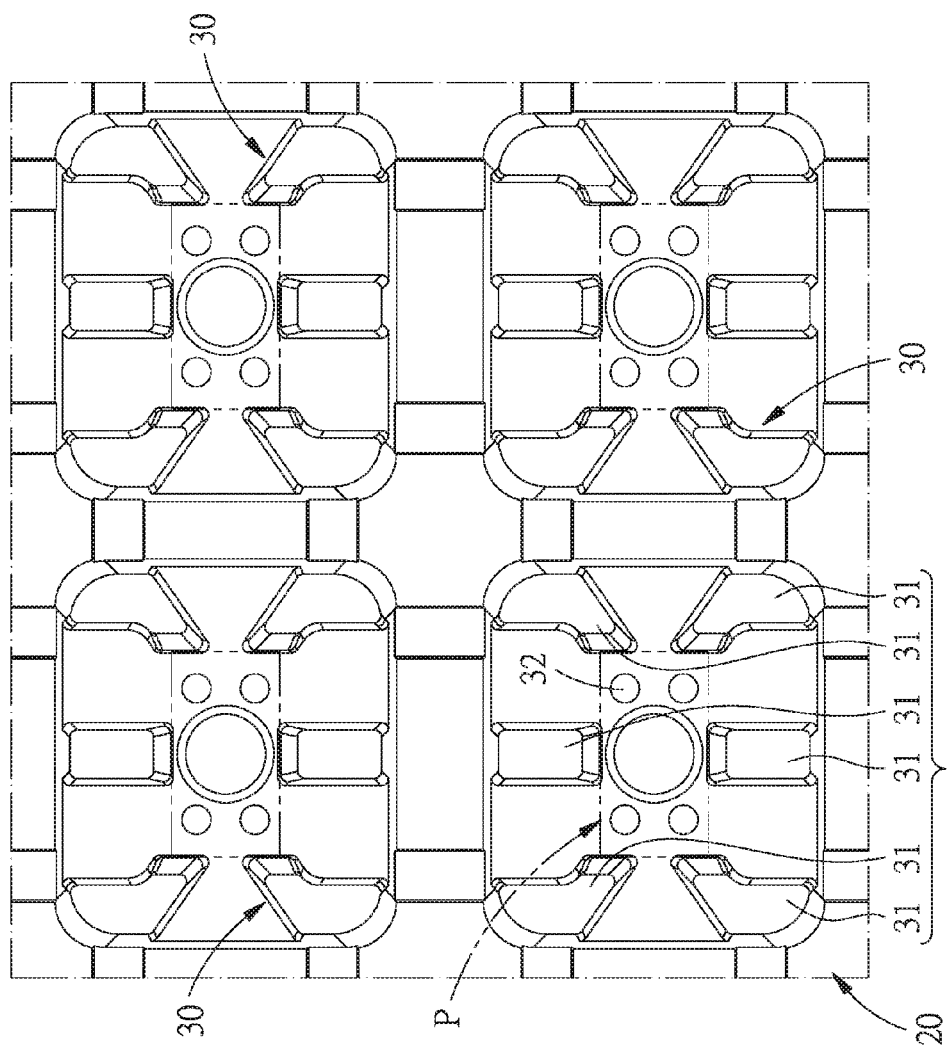
FIG. 4 is a top view of the tray in FIG. 3.
Figure 5:
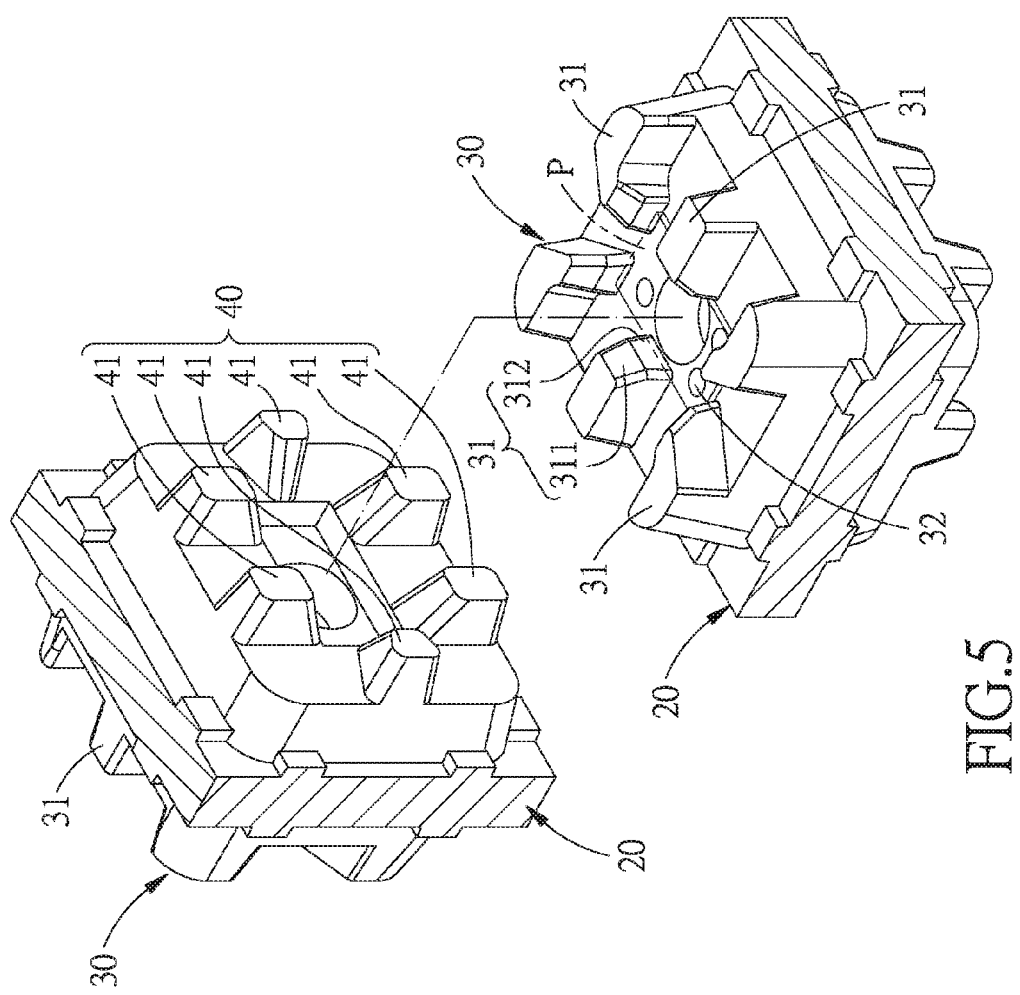
FIG. 5 shows how the tray in FIG. 3 is stacked with an identical tray.
Figure 6:
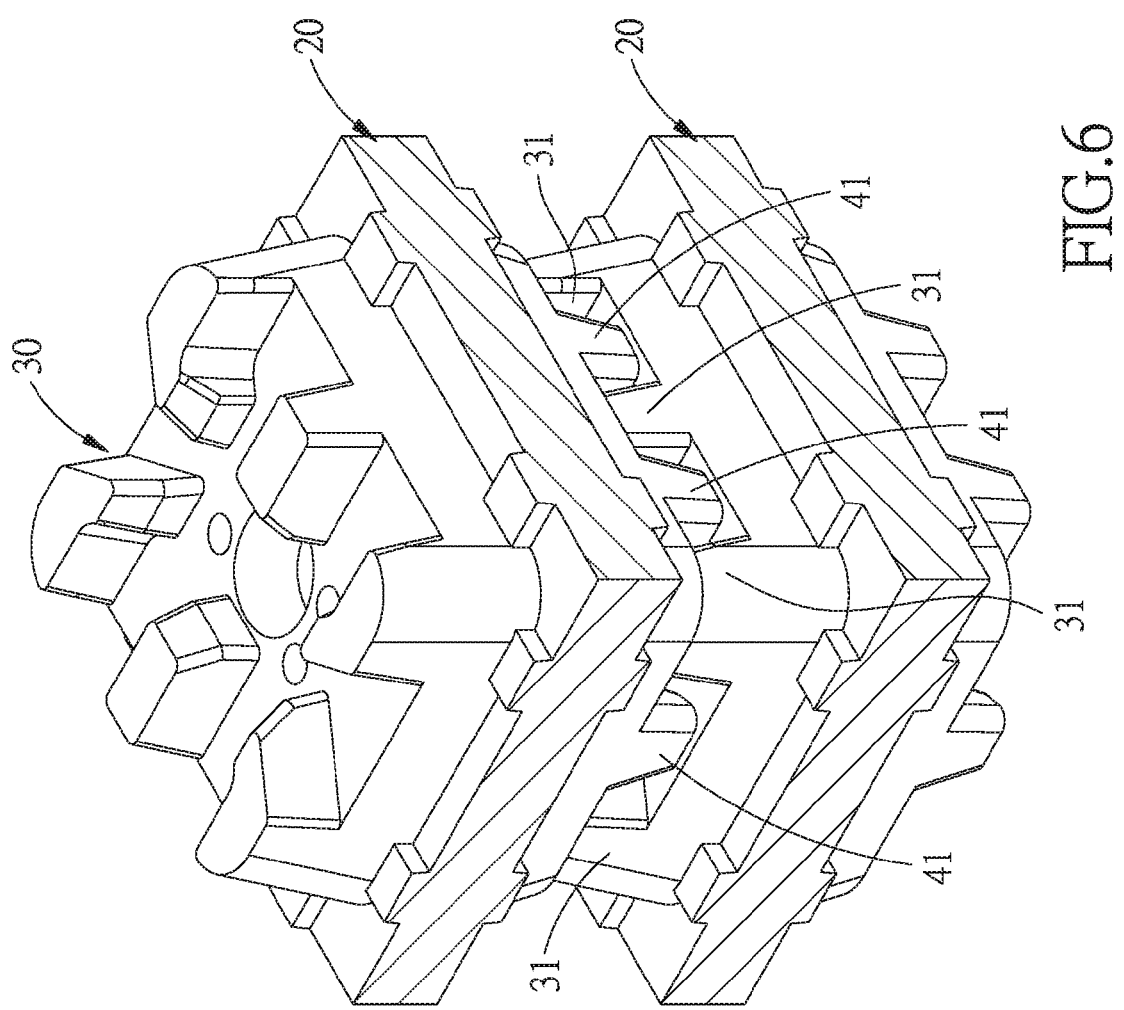
FIG. 6 is a perspective view of the trays in FIG. 5 when stacked together.

The present invention provides a tray for semiconductor devices. Referring to FIG. 3 to FIG. 6, the tray in the first embodiment of the present invention includes a base 20. One side of the base 20 is formed with at least one positioning unit 30, and the opposite side of the base 20 is formed with at least one reinforcing positioning unit 40, whose number corresponds to that of the at least one positioning unit 30.

The positioning unit 30 includes a plurality of tiered projections 31 which are spaced from one another. Each tiered projection 31 includes an inclined surface portion 311 and an upright surface portion 312 connected between the inclined surface portion 311 and the base 20, wherein the inclined surface portion 311 is a surface inclined with respect to the upright surface portion 312. The positioning unit 30 in this embodiment includes six tiered projections 31, which are arranged in a two-by-three array, i.e., an array of two columns and three rows. In this embodiment, the upright surface portions 312 in the first row are parallel to the upright surface portions 312 in the last row, whereas the upright surface portions 312 in the middle row are perpendicular to the upright surface portions 312 in the first and the last rows; the two tiered projections 31 in the first row form a trapezoidal space therebetween, and so do the two tiered projections 31 in the last row; and the upright surface portions 312 of the six tiered projections 31 jointly define, and face, an enclosed space W. The inclined surface portion 311 of each tiered projection 31 in this embodiment is inclined starting from its joint with the corresponding upright surface portion 312 to a direction away from the enclosed space W; in other words, going down the inclined surface portion 311 toward its joint with the upright surface portion 312 is equivalent to approaching the enclosed space W. In addition, the base 20 is formed with a plurality of abutting protuberances 32 in the enclosed space W. Each abutting protuberance 32 is formed as a smooth dome-shaped block.

The reinforcing positioning unit 40 includes a plurality of reinforcing projections 41 which are spaced from one another. The positions of the reinforcing projections 41 on the base 20 are different from those of the tiered projections 31. In this embodiment, the reinforcing positioning unit 40 includes six reinforcing projections 41, whose positions correspond respectively to the space between the two first-row tiered projections 31, the space between the two last-row tiered projections 31, and the spaces between the tiered projections 31 in each of the two columns. Besides, the reinforcing projections 41 corresponding respectively in position to the space between the two first-row tiered projections 31 and the space between the two last-row tiered projections 31 are trapezoidal columns. When two trays of the present invention are stacked together, the reinforcing projections 41 of the reinforcing positioning unit 40 of one tray are situated between the tiered projections 31 of the positioning unit 30 of the other tray. More specifically, the reinforcing projections 41 of the reinforcing positioning unit 40 of the former tray are situated not only between the tiered projections 31 of the positioning unit 30 of the latter tray, but also around the enclosed space W of the latter tray.

The structural configurations and features of the tray of the present invention for use with semiconductor devices have been described above. To use the tray, a semiconductor device P, such as a chip or wafer, is placed in the enclosed space W on the base 20 and is thus confined between the upright surface portions 312 of the tiered projections 31 of the positioning unit 30. With the upright surface portions 312 of the tiered projections 31 restraining the semiconductor device P securely, the tray carries the semiconductor device P in a stable manner.

When used for transportation, the tray still provides high carrying stability. Since the semiconductor device P abuts against the upright surface portions 312 of the six tiered projections 31, the possibility of the semiconductor device P bouncing in the enclosed space W is greatly reduced, even when the tray is subjected to vibrations during transportation.

When bouncing in the enclosed space W, the semiconductor device P may bounce from a position corresponding to the upright surface portions 312 to a position corresponding to the inclined surface portions 311 due to the fact that the enclosed space W is surrounded by the tiered projections 31, and that each tiered projection 31 includes an inclined surface portion 311 and an upright surface portion 312. But even if the semiconductor device P bounces to a position corresponding to the inclined surface portions 311, the inclined surface portions 311 of the tiered projections 31 will guide the semiconductor device P toward the enclosed space W because the farther we go along each inclined surface portion 311 toward its joint with the corresponding upright surface portion 312, the closer we are to the enclosed space W. That is to say, the semiconductor device P will be automatically adjusted and eventually return to the enclosed space W.

Moreover, since each tiered projection 31 includes an inclined surface portion 311 and an upright surface portion 312, the upper one of a stack of two trays of the present invention is in contact with not more than the end of the inclined surface portion 311 of each tiered projection 31 of the lower tray that faces away from the corresponding upright surface portion 312, allowing the inclined surface portions 311 of the lower tray to adjust the semiconductor device P on the lower tray and displace the semiconductor device P toward the enclosed space W, thereby preventing the semiconductor device P from bouncing to the tops of the inclined surface portions 311. This arrangement can without doubt reduce the chance of the semiconductor device P being damaged by the upper tray and hence lead to high product yield and high economic value.

Furthermore, when two trays of the present invention are stacked together, the reinforcing projections 41 of the reinforcing positioning unit 40 of the upper tray are located between the tiered projections 31 of the lower tray to produce a position-limiting effect, whereby the two trays are restrained by each other and strictly limited in position. In addition, with the reinforcing projections 41 of the reinforcing positioning unit 40 of the upper tray arranged around the enclosed space W of the lower tray, the semiconductor device P in the enclosed space W of the lower tray is surrounded by both the reinforcing projections 41 of the reinforcing positioning unit 40 of the upper tray and the tiered projections 31 of the positioning unit 30 of the lower tray. As such, the trays provide even higher carrying stability and can hold the semiconductor device P even more securely in place.

Apart from the trapezoidal column-shaped reinforcing projections 41, the present invention provides corresponding spaces for receiving them respectively. When two trays of the present invention are stacked together, therefore, the engagement between the trapezoidal column-shaped reinforcing projections 41 of the upper tray and the trapezoidal spaces between the tiered projections 31 of the lower tray effectively reduces horizontal sliding displacement between the two trays and thereby ensures stability of the stack.

Figure 7:
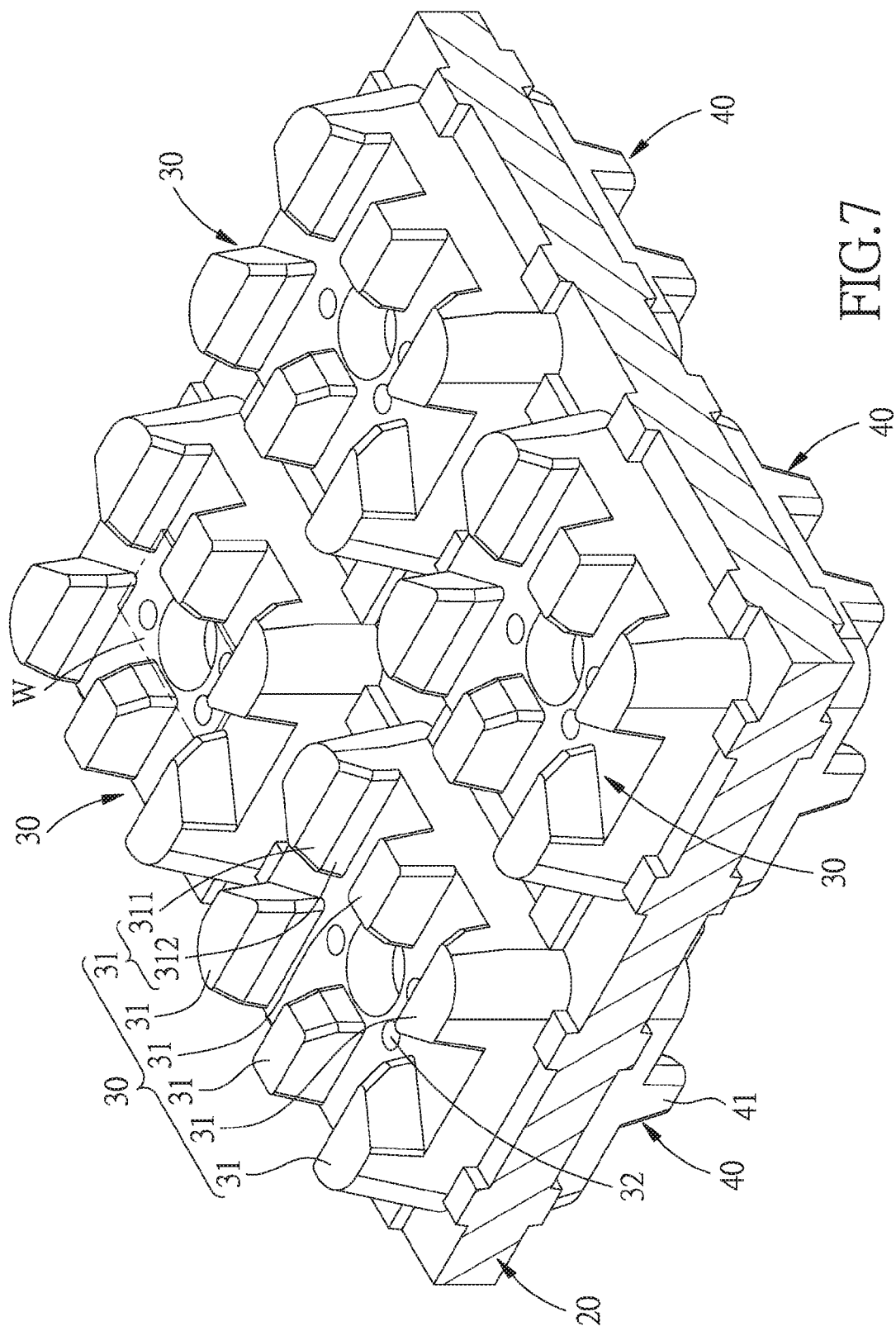
FIG. 7 is a perspective view of the tray for semiconductor devices in a second embodiment of the present invention.
Figure 8:
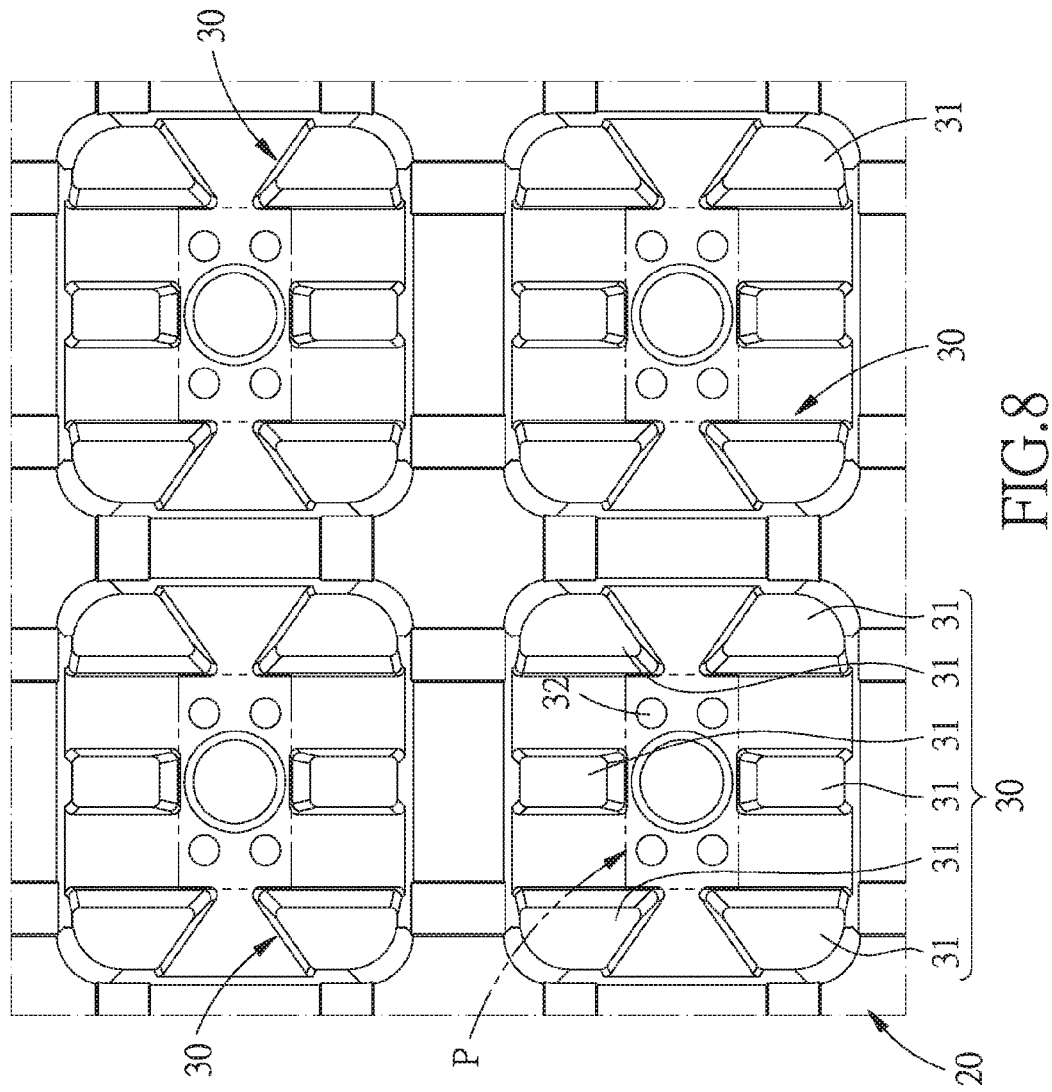
FIG. 8 is a top view of the tray in FIG. 7.
Figure 9:
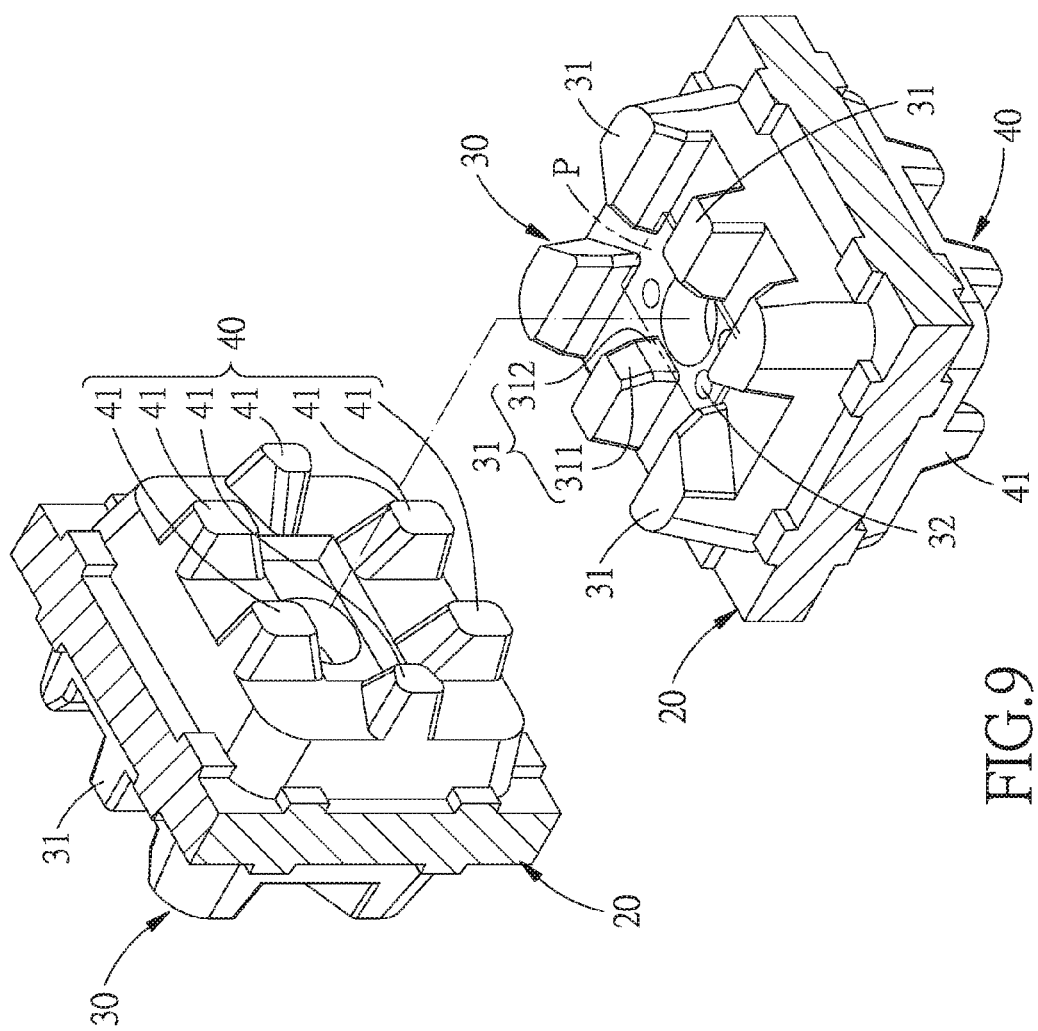
FIG. 9 shows how the tray in FIG. 7 is stacked with an identical tray.
Figure 10:
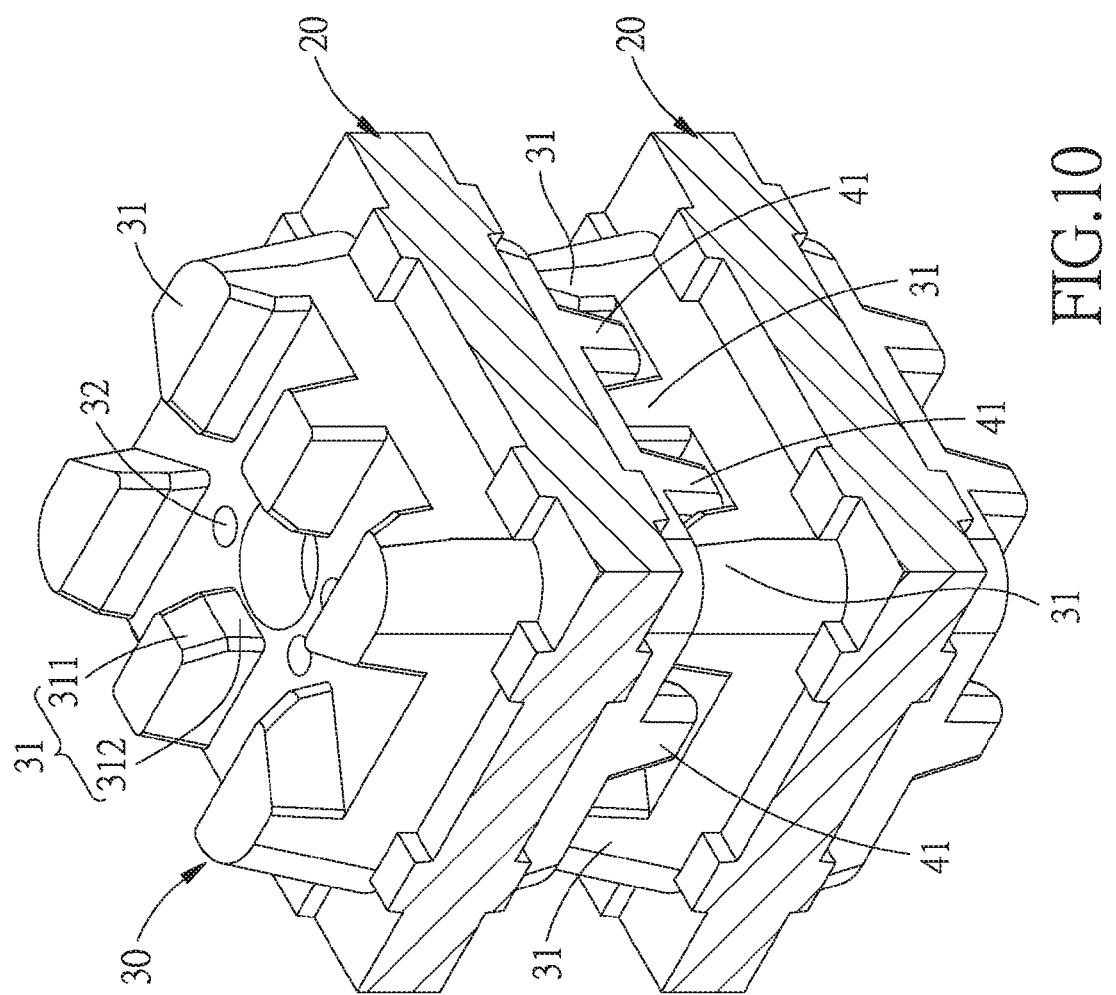
FIG. 10 is a perspective view of the trays in FIG. 9 when stacked together.

FIG. 7 to FIG. 10 show the second embodiment of the present invention. This second embodiment is different from the first embodiment only in the shapes of the tiered projections 31 of the positioning unit 30. The second embodiment is intended mainly to demonstrate that, despite the different looks of the tiered projections 31 of the positioning unit 30, the objective and effects of the present invention can be equally achieved, provided that each tiered projection 31 includes an inclined surface portion 311 and an upright surface portion 312. All such different embodiments should fall within the scope of the present invention.

What is claimed is:

1. A tray for semiconductor devices, comprising a base having a side formed with at least one positioning unit, and having an opposite side formed with at least one reinforcing positioning unit corresponding in number to the at least one positioning unit, the tray being characterized in that:

the positioning unit comprises six tiered projections spaced from one another, each said tiered projection comprises an inclined surface portion and an upright surface portion, each said upright surface portion is connected between a corresponding said inclined surface portion and the base, each said inclined surface portion is a surface inclined with respect to the corresponding upright surface portion, and the upright surface portions of the tiered projections jointly define, and face, an enclosed space for receiving a semiconductor device, wherein the six said tiered projections are arranged in an array of two columns and three rows, the upright surface portions in a first said row are parallel to the upright surface portions in a last said row, the upright surface portions of a middle said row are perpendicular to the upright surface portions in the first row and the upright surface portions in the last row, the reinforcing positioning unit comprises six said reinforcing projections, and the reinforcing projections correspond respectively in position to a space between the two tiered projections in the first row, a space between the two tiered projections in the last row, and spaces between the tiered projections in each of the two columns.

2. The tray of claim 1, wherein the inclined surface portion of each said tiered projection is inclined starting from a joint of the inclined surface portion and the corresponding upright surface portion to a direction away from the enclosed space.

3. The tray of claim 1, wherein the base is further formed with a plurality of abutting protuberances in the enclosed space, and each said abutting protuberance is a smooth dome-shaped block.

4. The tray of claim 1, wherein when two said trays are stacked together, the reinforcing projections of the reinforcing positioning unit of one of the trays are situated between the tiered projections, and surround the enclosed space, of the positioning unit of the other tray.

\* \* \* \* \*